United States Patent
Hanabe et al.

(10) Patent No.: US 6,383,287 B1
(45) Date of Patent: May 7, 2002

(54) SYSTEM AND METHOD FOR PERFORMING DIFFUSION ON A THREE-DIMENSIONAL SUBSTRATE

(75) Inventors: Murali Hanabe; Nainesh J. Patel, both of Plano; Michael Perdue, Richardson, all of TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/672,566

(22) Filed: Sep. 28, 2000

(51) Int. Cl.$^7$ ............................................... C30B 25/04
(52) U.S. Cl. ...................... 117/84; 117/200; 117/900; 422/246
(58) Field of Search ................................ 117/200, 900, 117/84; 118/723 I, 723 E; 422/246

(56) References Cited

U.S. PATENT DOCUMENTS

| | | | |
|---|---|---|---|
| RE31,473 E | 12/1983 | Kilby et al. ................... 425/6 |
| 4,738,831 A | 4/1988 | Naumann et al. ........... 422/246 |
| 4,749,615 A | 6/1988 | Bonney et al. ........... 428/310.6 |
| 5,069,740 A | 12/1991 | Levine et al. ............. 156/616.2 |
| 5,223,452 A | 6/1993 | Knepprath ................... 437/165 |
| 5,278,097 A | 1/1994 | Hotchkiss et al. .......... 437/164 |
| 5,462,639 A | 10/1995 | Matthews et al. ........ 156/662.1 |
| 5,560,543 A | 10/1996 | Smith et al. .............. 239/102.2 |
| 5,571,366 A | 11/1996 | Ishii et al. ................... 156/345 |
| 5,817,173 A | 10/1998 | Nakata ......................... 117/73 |
| 5,955,776 A | 9/1999 | Ishikawa ..................... 257/618 |
| 6,041,735 A | 3/2000 | Murzin et al. ............. 118/723 I |
| 6,055,928 A | 5/2000 | Murzin et al. ........... 118/723 E |
| 6,117,772 A | 9/2000 | Murzin et al. .............. 438/681 |
| 6,120,602 A | 9/2000 | Stephens et al. ............. 117/200 |

FOREIGN PATENT DOCUMENTS

| | | |
|---|---|---|
| DE | 25 03 452 | 7/1975 |
| DE | 44 27 686 A1 | 2/1995 |
| EP | 0 947 613 A1 | 10/1999 |
| JP | 02-119241 | 5/1990 |
| JP | 59117109 A | 6/1994 |
| JP | 10033969 | 2/1998 |

Primary Examiner—Felisa Hiteshew
(74) Attorney, Agent, or Firm—Hayes and Boone, LLP

(57) ABSTRACT

A system and method for performing diffusion on a three-dimensional substrate is provided. The system includes a furnace for providing a doped (e.g., p-type) molten semiconductor material and a dropper for converting the molten semiconductor material into a series of uniformly sized droplets. The droplets are then provided to a first tube where they solidify into a semiconductor crystals. The semiconductor crystals are then heated for a predetermined period of time until an outer layer of the semiconductor crystals is melted. The melted outer layer can then be doped (e.g., n-type) and then allowed to re-solidify. As a result, a plurality of spherical shaped p-n devices is created.

17 Claims, 2 Drawing Sheets

SYSTEM AND METHOD FOR PERFORMING DIFFUSION ON A THREE-DIMENSIONAL SUBSTRATE

BACKGROUND OF THE INVENTION

The invention relates generally to semiconductor devices, and more particularly, to an apparatus and method for performing diffusion on a device such as a spherical-shaped semiconductor diode.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

Manufacturing the wafers requires creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above process typically have many defects. These defects can be attributed to the difficulty in making a single, highly pure crystal due to the cutting, grinding and cleaning processes as well as impurities associated with containers used in forming the crystals. These defects become more and more prevalent as the integrated circuits formed on these wafers contain smaller and smaller dimensions.

In U.S. Pat. No. 5,955,776, which is hereby incorporated by reference, a method and apparatus for manufacturing spherical-shaped semiconductor integrated circuit devices is disclosed. Although certain systems and methods for performing various processing operations are discussed in the above-referenced patent, it is desired to further improve on the operations. For example, in making a p-n junction diode, a first type (e.g. n-type) outer layer is diffused onto a second type (e.g., p-type) spherical shaped semiconductor substrate. It is desired that both the outer layer and the inner substrate are maintained at an appropriate shape, thickness, and diffusion concentration.

U.S. Pat. Ser. Nos. 09/490,650 and 09/489,782, which are hereby incorporated by reference, provide improved methods for doping material on a spherical shaped substrate in a non-contact environment. These methods can be used to make spherical p-n junction diodes for solar cell applications. It is desired, however, to make uniform sized spherical p-n diodes in a continuous operation (e.g., a single step).

SUMMARY OF THE INVENTION

The present invention, accordingly, provides a system and method for performing diffusion on a three-dimensional substrate. In one embodiment, the system includes a furnace for providing a doped (e.g., p-type) molten semiconductor material and a dropper for converting the molten semiconductor material into a series of uniformly sized-droplets. The droplets are then provided to a first tube where they solidify into semiconductor crystals.

The semiconductor crystals are then heated for a predetermined period of time until an outer layer of the semiconductor crystals is melted. The melted outer layer can be doped (e.g., n-type) using liquid state diffusion, and then allowed to re-solidify. As a result, a plurality of spherical shaped p-n devices is created.

In some embodiments, the semiconductor crystals are polished before they are melted. The polishing helps to remove deformities and better insure that the outer layer is of a desired thickness.

In some embodiments, the dropper utilizes a vibrating nozzle.

One embodiment of the method for making a p-n junction on a three-dimensional substrate includes forming a solid spherical shaped semiconductor crystal of a first dopant type. An outer layer of the spherical shaped semiconductor crystal is then melted to a predetermined thickness. A second dopant type can then be provided to the melted outer layer to be diffused into the outer layer. As a result, the doped and melted outer layer can be solidified to form the a p-n junction device.

Therefore, what is provided is an improved system and method for performing diffusion on a three-dimensional substrate. In the present example, the system and method can be used to make spherical shaped diodes with a uniform layer thickness in a single step operation.

DESCRIPTION OF THE PREFERRED EMBODIMENT

The present disclosure relates to semiconductor processing. It is understood that the following disclosure provides many different embodiments, or examples, for implementing different features of the invention. Specific examples of components, sizes, and arrangements are described below to simplify the present disclosure. These are, of course, merely examples and are not intended to limit the invention from that described in the claims.

Figure 1:
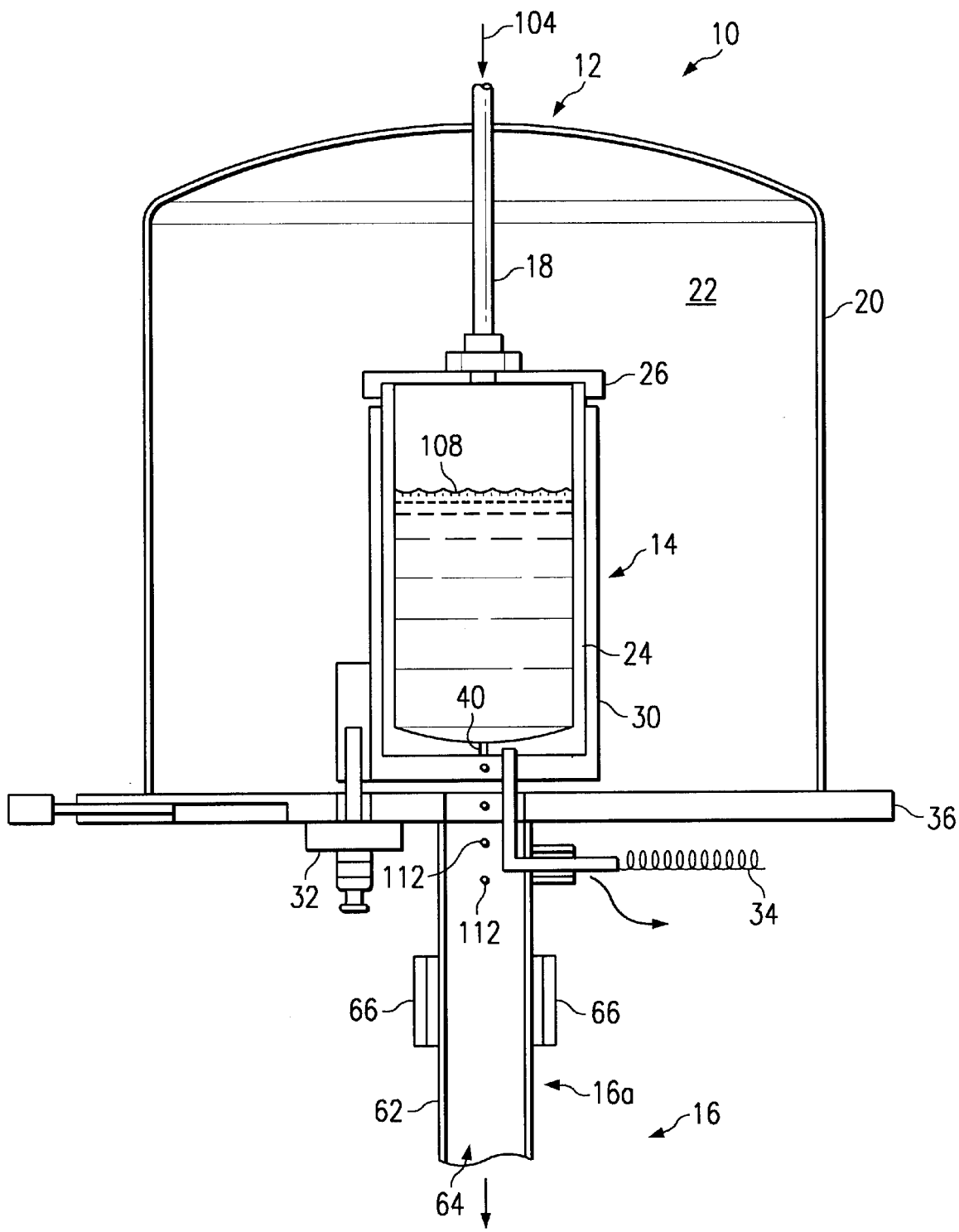
FIG. 1 illustrates a side, cut-away view of a processor according to one embodiment of the invention.

Referring to FIG. 1, the reference numeral 10 designates, in general, one embodiment of a processor for forming spherical shaped semiconductor substrates. Formation of the substrates may be facilitated in different manners by varying parameters described herein, including repetitive processing through portions of the processor 10.

The processor 10 can be separated into three sections: an input section 12, a main furnace section 14, and a drop section 16. The input section 12 includes a receiver tube 18 for receiving processing materials, such as granules, gases and the like. The receiver tube 18 is about 2 centimeters in diameter and registers with the main furnace section 14.

An enclosure 20 surrounds the main furnace section 14 and supports a general environment for processing. The enclosure is filled with an insulative material 22 to contain the relatively high temperatures produced in the main furnace section. The enclosure 20 and insulative material 22 provide an inert atmosphere, which prevents burnout of the insulation material 22 and other components stored therein. Disposed within the insulative material is a crucible 24. The crucible serves to hold molten semiconductor material, yet not react with the material.

A lid 26 of the crucible 24 connects to the receiver tube 18. In the present embodiment, the lid is threadably engaged to the receiver tube to facilitate removal and separation of the various components. The lid 26 further maintains the inert atmosphere inside the enclosure. Alternative embodiments may have other types of lids that either temporarily or permanently secure the receiver tube 18 to the crucible 24. The receiver tube 18 can either batch feed or continuously feed raw semiconductor material from the crucible 24. For each type of feeding, a different lid 26 may be required.

Immediately surrounding the outside of the crucible 24 is a furnace 30. In the present embodiment, the furnace is a fluid-heat type furnace, although other sources of heat may be used. The furnace 30 includes a fluid nozzle 32 through which the fluid may pass. The fluid nozzle 32 further maintains the inert atmosphere inside the enclosure 20. Although not shown, another device may be used to heat the fluid before it passes through the fluid nozzle 32. Also, a heat measurement device 34, such as a thermocouple, is attached to the furnace 30 for monitoring the temperature of the furnace 30 and of the crucible 24.

The enclosure 20, along with the crucible 24, rests-on a support platform 36. The platform has several apertures to facilitate the various devices and processes herein disclosed. The platform 36 is also able to withstand some of the severe heat that radiates from the furnace 30 while maintaining the inert atmosphere inside the enclosure 20.

Figure 2:
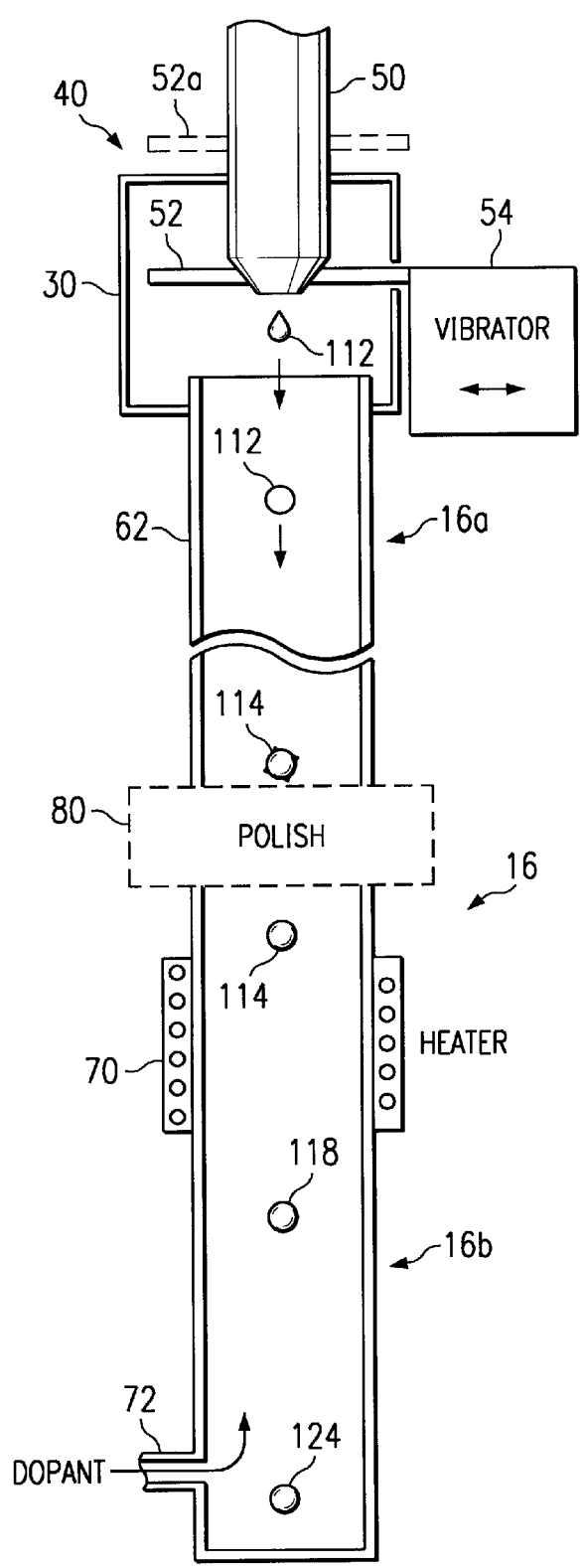
FIG. 2 is an extended view of the processor of FIG. 1.

Referring also to FIG. 2, attached to a bottom portion of the crucible 24, as seen in FIG. 1, is a dropper 40. The dropper 40 may include a nozzle 50 that injects precise sized droplets of molten semiconductor material from the crucible 24 and into the drop section 16. In one embodiment, the nozzle 50 is further connected to a vibrating plate 52 connected to a piezo-electric (PZT) vibrator 54. The vibrating plate 52 can be positioned in several different locations, such as a position 52a illustrated in FIG. 2 in phantom. The PZT vibrator 54 can be controlled to produce a precise movement, which in turn creates a precise size droplet. Alternatively, or in combination with the nozzle, inert gas may also be applied to facilitate the precise amounts of molten semiconductor material being injected into the drop section 16.

The drop section 16 may be further divided into a first drop section 16a; and a second drop section 16b. The first drop section 16a includes a long drop tube 62. For example, the drop tube 62 may be stainless steel with an electro-polished inside finish, about five to ten centimeters in diameter and about ten meters in length. The drop tube 62 may include apertures through which a cooling gas 64 may flow. The cooling gas may also include impurities for doping the semiconductor material to a desired level. In some embodiments, a first heater 66 is placed adjacent to the drop tube 62. The first heater 66 maintains a temperature below the melting point of the semiconductor material. However, the temperature is high enough to slow the cooling process of the semiconductor material to thereby reduce the number of different crystalline growth directions formed during solidification.

Connected to the first drop section 16a is the second drop section 16b, which includes a second heater 70. The second drop section 16b may also be stainless steel with an electro-polished inside finish, about five to ten centimeters in diameter and about ten meters in length. The second heater 70 maintains a temperature above the melting point of the semiconductor material. It is understood, however, that in some embodiments, the first heater 66 does not exist. Therefore, in these embodiments, the second heater 70 is the only heater in the drop section 16.

The second drop section 16b also includes an inlet 72 for providing a dopant gas. The dopant gas includes impurities for doping semiconductor material in the drop section 16b.

In some embodiments, the first and second drop sections 16a, 16b are connected to form one single drop tube 16. In other embodiments, the drop sections 16a, 16b are separated, and material must be transported from the first drop section to the second.

In some embodiments, a polishing system 80 is provided between the first and second drop sections 16a, 16b. For example, the polishing system 80 may be a simple "barreling" type of polisher that roughly polishes the outer surface of a spherical substrate. One such polishing system is described in U.S. Pat. No. 5,955,776, which is hereby incorporated by reference.

In operation, material 104 is placed into the receiver tube 18. For the sake of example, the material includes silicon, it being understood that different types of semiconductor material may also be used. The material 104 may also include an inert carrier gas, such as argon, and one or more dopant materials. The material 104 passes through the lid 26 and into the main furnace section 14. The furnace 30 can produce temperatures of about 1600° C., which far exceed the melting point of silicon (about 1410° C.). This high temperature causes the material 104 to become a molten mass 108.

Figure 3A:
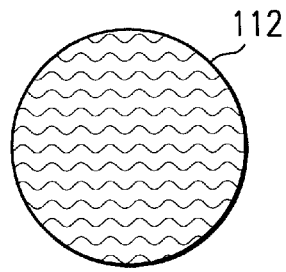
FIGS. 3a–3d illustrate different stages of a semiconductor device being processed by the processor of FIGS. 1 and 2.

Referring also to FIG. 3a, the nozzle 40 allows droplets 112 of the molten mass to leave the crucible 24 and enter the drop section 16. The droplets 112 fall down the drop tube 62. The drop tube will allow the droplets to cool and form a polycrystalline structure. The cooling gases 64 may be, for example, helium, hydrogen, argon, or nitrogen to facilitate the cooling of the droplets. The cooling gases 64 may also be used to control the rate of descent of the droplets 112.

In some embodiments, the processor 10 controls the rate at which the droplets 112 cool. This may occur by many different methods. For example, the cooling gases 64 may be heated. Also, the drop tube 62 may be heated by the heaters 66. As a result, the droplets 112 will cool very slowly, thereby forming crystals.

Figure 3B:
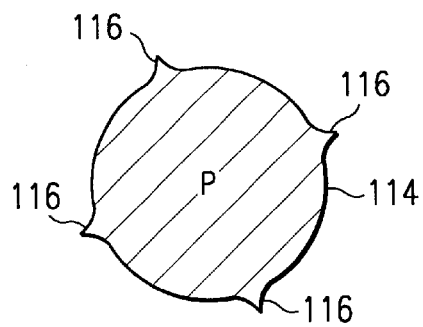

Referring to also to FIG. 3b, as the droplets 112 approach the bottom portion of the first drop section 16a, as seen in FIG. 2, the cooled droplets form a solid, spherical shaped crystal substrate 114. In the present example, the spherical shaped crystal substrate 114 has a diameter of about 1 millimeter. In some embodiments, the substrate 114 is a single crystal, while in other embodiments, the substrate is a polycrystal. The substrate 114 has been doped by one or more of the materials provided in the receiver tube 18, and/or the cooling gas 64. For the sake of example, the substrate 114 will be deemed to be doped with P-type material.

It is noted that sometimes, a plurality of deformities, such as spikes 116, are formed during the cooling process. These spikes 116 can be removed by the polishing system 80. By removing the spikes, later processing of the device can be more precisely controlled. However, as will become more evident in the following discussion, the spikes 116 may eventually be removed from the substrate 114 by later processing. The substrate 114 (polished or not) is then provided into the second drop section 16b.

Figure 3C:
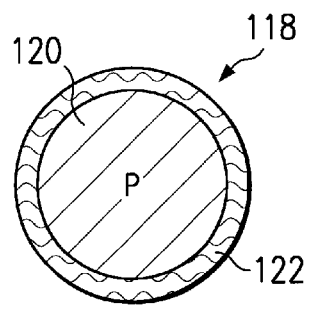

Referring now to FIG. 3c, the relatively high temperature created by the second heater 70 exceeds the melting point of the semiconductor material. As a result, the substrate, now designated with the reference numeral 118, has a solid core portion 120 and a melted outer layer 122. The thickness of the melted outer layer 122 can be precisely controlled by the amount of time the substrate 118 is in the second drop section 16b and the temperature inside the second drop section. For example, the dopant gas from inlet 72 may serve to float (to control or sustain the descent of) the substrate 118 inside the second drop section 16b for a predetermined period of time. In another example, the overall length of the second drop section 16b can be precisely determined to accommodate the desired thickness of the melted outer layer 122.

Once the melted outer layer 122 is formed, it is susceptible to receive impurities. These impurities can be provided by the dopant gas from the inlet 72. In continuance of the previous example, the impurities may be ntype, as contrasted with the p-type core portion 120.

Figure 3D:
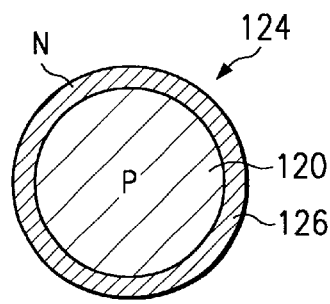

Referring now to FIG. 3d, once the impurities have been deposited into the melted outer layer 122, the substrate, now designated with the reference numeral 124, can be cooled. Once cooled, a solidified outer layer 126 is formed, having a precise and uniform thickness. In the present example, a P-N diode of precise dimension has thereby been formed.

It is understood that several variations may be made in the foregoing. For example, different heating steps may be used in different parts of the processor. Further still, a catcher (not shown) may be included to receive the material and facilitate the heating or cooling process. The catcher may also be used to return the material to a furnace section for additional processing. Other modifications, changes and substitutions are also intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method of processing a spherical shaped semiconductor diode, the method comprising the steps of:
   forming a solid spherical shaped semiconductor crystal of a first dopant;
   melting an outer layer of the spherical shaped semiconductor crystal;
   providing a second dopant to the melted outer layer to be diffused into the outer layer;
   solidifying the melted outer layer to form the spherical shaped semiconductor diode.

2. The method of claim 1 further comprising:
   polishing the solid spherical shaped semiconductor crystal before melting the outer layer.

3. The method of claim 1 wherein the steps of melting, providing, and solidifying are performed while containing the spherical shaped semiconductor crystal in a non-contact environment.

4. The method of claim 3 wherein the containing is performed by allowing the spherical shaped semiconductor crystal to fall while it is being processed.

5. The method of claim 3 wherein the containing is performed by floating the spherical shaped semiconductor crystal while it is being processed.

6. The method of claim 1 wherein second dopant is provided with a carrier gas and the carrier gas also serves to float the spherical shaped semiconductor crystal while it is being processed.

7. A system for processing a spherical shaped semiconductor diode, the system comprising:
   means for forming a solid spherical shaped semiconductor crystal of a first dopant;
   means for melting an outer layer of the spherical shaped semiconductor crystal;
   means for providing a second dopant to the melted outer layer to be diffused into the outer layer;
   means for solidifying the melted outer layer to form the spherical shaped semiconductor diode.

8. The system of claim 7 further comprising:
   means for polishing the solid spherical shaped semiconductor crystal before melting the outer layer.

9. The system of claim 7 wherein the means for melting, providing, and solidifying perform the corresponding functions in a non-contact environment.

10. The system of claim 9 wherein the means for melting, providing, and solidifying perform the corresponding functions while the spherical shaped semiconductor crystal is floating.

11. The system of claim 7 wherein the second dopant is provided with a carrier gas and the carrier gas also serves to float the spherical shaped semiconductor crystal while it is being processed.

12. The system of claim 7 further comprising:
   means for forming a liquid droplet of semiconductor material of a predetermined volume.

13. The system of claim 12 wherein the means for forming a liquid droplet utilizes a piezo-electric vibrator.

14. A system for processing a series of spherical shaped semiconductor devices, the system comprising:
   a furnace for providing a molten semiconductor material;
   a dropper for converting the molten semiconductor material into a series of uniformly sized droplets;
   a first tube for allowing the series of droplets to solidify into a series of semiconductor crystals;
   a second tube for receiving the series of semiconductor crystals;
   a heater for heating an interior portion of the second tube to a temperature above the melting point of the semiconductor material;
   means for allowing the series of semiconductor crystals to move through the second tube until an outer layer of the semiconductor crystals is melted;
   an inlet for introducing a dopant into the second tube for reacting with the melted outer layer of the semiconductor crystals; and
   means for allowing each semiconductor crystal with the doped outer layer to solidify, thereby creating the series of series of spherical shaped semiconductor devices.

15. The system of claim 14 further comprising:
   a polisher positioned between the first and second tubes.

16. The system of claim 14 wherein the first and second tubes are joined to form a single, larger tube.

17. The system of claim 14 wherein the dropper utilizes a vibrating nozzle.

* * * * *